United States Patent
Uchizaki

(10) Patent No.: US 6,693,871 B2
(45) Date of Patent: Feb. 17, 2004

(54) INTEGRATED UNIT, OPTICAL PICKUP, AND OPTICAL RECORDING MEDIUM DRIVE DEVICE

(75) Inventor: Ichiro Uchizaki, Fujisawa (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 10/285,025

(22) Filed: Oct. 30, 2002

(65) Prior Publication Data

US 2003/0063552 A1 Apr. 3, 2003

Related U.S. Application Data

(63) Continuation of application No. 09/670,858, filed on Sep. 26, 2000, now Pat. No. 6,496,469.

(30) Foreign Application Priority Data

Sep. 27, 1999 (JP) ............................................. 11-273380

(51) Int. Cl.[7] ................................................. G11B 7/00
(52) U.S. Cl. ....................................... 369/120; 369/121
(58) Field of Search ......................... 369/44.12, 112.01, 369/112.02, 112.27, 112.29, 120, 121, 122

(56) References Cited

U.S. PATENT DOCUMENTS 6,072,579 A    6/2000    Funato    .................. 369/112.12

FOREIGN PATENT DOCUMENTS

| JP | 60-140775 | 7/1985 |
|---|---|---|
| JP | 61-153360 | 7/1986 |
| JP | 04-155983 | 5/1992 |
| JP | 04-196189 | 7/1992 |
| JP | 05-205295 | 8/1993 |
| JP | 11-066590 | 3/1999 |
| JP | 11-149652 | 6/1999 |

*Primary Examiner*—Paul W. Huber
(74) *Attorney, Agent, or Firm*—Gray, Cary, Ware & Freidenrich LLP

(57) ABSTRACT

The medium of a disk for CD-R is a pigmentation material so readout by a 650-nm laser diode (LD) is not possible. Since CD-R is becoming popular in the marketplace, there are demands for a DVD readout device that is capable of reading CD-R format disks. An integrated semiconductor laser element is created by forming a two-wavelength LD monolithically on a GaAs substrate, and that laser element emits a laser beam that is reflected by a 45° mirror incorporated in a flat package.

If a three-part holographic element is used, and the light-receiving element and an amplification circuit are integrated on a silicon substrate, it is possible to implement a small, light-weight optical pickup with fewer components.

24 Claims, 13 Drawing Sheets

INTEGRATED UNIT, OPTICAL PICKUP, AND OPTICAL RECORDING MEDIUM DRIVE DEVICE

CROSS REFERENCE TO RELATED APPLICATIONS

This application is a continuation of and claims the benefit of U.S. application Ser. No. 09/670,858, filed Sep. 26, 2000 now U.S. Pat. No. 6,496,469, the disclosure of which is incorporated herein by reference.

BACKGROUND OF THE INVENTION

The present invention relates to an optical integrated unit, an optical pickup, and an optical recording medium drive device. More specifically, the present invention relates to a flat-package type of optical integrated unit incorporating an integrated laser source for a plurality of operating wavelengths, such as those for DVD-ROM and CD-R disks, for reading signals recorded on an optical recording medium such as an optical disk and writing thereto, and also to an optical pickup using that optical integrated unit and an optical recording medium drive device using that optical pickup.

Digital versatile disk (DVD) systems are being developed for recording large volumes of data within a compact and also portable recording medium. When it comes to implementing such a system, it is preferable to provide compatibility that can also reproduce from disks of prior-art formats, such as compact disk, read-only memory (CD-ROM) and compact disk recordable (CD-R).

A semiconductor laser diode (herein after abbreviated to LD) of a wavelength of approximately 780 nm is used for readout from a CD-R, but an LD of a wavelength of 650 nm is used for DVD, for implementing a recording density of approximately seven times that of a CD-ROM. However, the recording medium used for CD-R is a pigmentation material and it is not possible to obtain sufficient sensitivity therewith in the 650-nm wavelength band used for DVDs. That is why it is essential to use an optical pickup that has two light sources, for implementing a DVD system that is compatible with CDs.

A schematic view of the configuration of a conventional two-light-source type of optical pickup for DVD is shown in FIG. 14. In this figure, reference number 101 denotes a 650-nm-wavelength optical integrated unit for DVD readout, 102 denotes a 780-nm-wavelength optical integrated unit for CD-R and CD-ROM readout, 103 denotes a prism, 104 denotes a collimator lens, 115 denotes a folding mirror, 106 denotes a wavelength selection filter, 107 denotes a focusing lens, 108 denotes a CD-format disk, and 109 denotes a DVD-format disk.

Each of the optical integrated units 101 and 102 is provided with a semiconductor laser that acts as a light source, alight-receiving element for detecting a light beam reflected from a disk, and a monitoring light-receiving element for controlling the output of the semiconductor laser.

An optical pickup that uses two independent light sources, such as that shown in FIG. 14, has problems as described below. The first problem relates to the complexity of adjusting the positions of the light sources because there are two optical axes, and the second problem is it is difficult to make the complete assembly smaller and lighter.

In order to solve these two problems, the present inventor and others have developed a integrated semiconductor laser element in which 650-nm and 780-nm light sources are integrated in a monolithic fashion on the same semiconductor substrate, which is designed to greatly simplify optical systems that use such a laser element. This was disclosed as Japanese Patent Application No. 10-181068.

A schematic view of a section through the structure of the integrated semiconductor laser element proposed by the present inventor and others in this application is shown in FIG. 15.

A perspective view in FIG. 16 shows essential components of an optical integrated unit in which an integrated semiconductor laser element is mounted in a CAN-type package, and a schematic view of the optical system of an optical pickup that uses this optical integrated unit is shown in FIG. 17.

As shown in FIG. 15, an integrated semiconductor laser element 31 has a 650-nm laser excitation portion 240 and a 780-nm laser excitation portion 241, formed in a monolithic manner on a common GaAs substrate 210. Respective p-side electrodes 233 and 234 of these laser excitation portions are attached by an adhesive material 351, such as an AuSn solder, on top of extraction electrodes 352 and 353 formed separately on top of an insulating substrate 354 of a material such as AlN. Reference number 358 denotes a metal block for heat dissipation.

In the optical integrated unit shown in FIG. 16, reference number denotes the previously mentioned integrated semiconductor laser element, 354 denotes an AlN insulating substrate, 358 denotes the metal block for heat dissipation, 359 denotes a photodiode (PD) for monitoring, and 360 denotes a divided PD for error detection and RF signal detection. These components are disposed on a stem 400 and are connected as appropriate by lead pins 404 and wires W through feed-throughs 402.

Components in FIG. 17 that are the same as those in FIG. 14 are denoted by the same reference numbers and further description thereof is omitted. In FIG. 17, reference number 361 denotes the optical integrated unit of FIG. 16 mounted in a CAN-type package.

It is clear that the optical system shown in FIG. 17 has a far simpler structure than that of the original optical system exemplified in FIG. 14, as a result of using a single optical integrated unit, so it can be made smaller and lighter.

However, there are still some technical problems to be solved with both the CAN-type optical integrated unit of FIG. 16 and the optical pickup of FIG. 17.

The first problem concerns the necessity of a high level of precision in the mounting of the LD 31 (in the X-Z plane) on a surface that is perpendicular to the mounting of the divided PD 360 (in the X-Y plane).

The second problem is that lead pins 361p, the metal block 358 for heat dissipation, the integrated semiconductor laser element 31, and IC chips (not shown in the figure) are disposed in a three-dimensional structure, which imposes a limit on the miniaturization of the assembly.

Concerning the first technical problem: the angle ($\alpha$) between the LD beam and the Z-axis is required to be within $\pm 1°$, the deviation in relative position (in the X-Y plane) between the luminous spot generated by the LD and the divided PD 360 is required to be within $\pm 5$ $\mu$m, and the deviation ($\beta$) between the angles of rotation of the LD 31 and the divided PD 360 is required to be within $\pm 0.5°$.

Concerning the second technical problem: this presents an obstacle to mounting the assembly in a notebook computer or personal data assistant (PDA) having an external thickness of 30 mm or less.

SUMMARY OF THE INVENTION

The present invention was devised in the light of the above described problems. In other words, an objective thereof is to provide a multi-wavelength optical integrated unit, optical pickup, and optical recording medium drive device which can be made much smaller, lighter, and slimmer than in the prior art, with a reduced number of components, reduced fabrication costs, and, simultaneously, an increased reliability.

In order to achieve this objective, an optical integrated unit in accordance with the present invention comprises a substrate and a semiconductor laser element mounted on a main surface of the substrate; wherein:

the semiconductor laser element has a configuration such that a first laser excitation portion for emitting a laser beam of a first wavelength and a second laser excitation portion for emitting a laser beam of a second wavelength that differs from the first wavelength are integrated in a monolithic manner, and also the laser beam of the first wavelength and the second laser beam are emitted in a substantially parallel direction with respect to the main surface of the substrate;

the substrate comprises:

a mirror surface inclined with respect to the main surface in such a manner that the first and second laser beams are reflected substantially perpendicularly upward with respect to the main surface; and means for providing electrical separation between a first mount portion corresponding to the first laser excitation portion and a second mount portion corresponding to the second laser excitation portion.

In this case, the means for separation could be a p-n junction formed on a front surface of the substrate.

An optical pickup in accordance with the present invention comprises the previously described optical integrated unit and an optical system which focuses the laser beam of the first wavelength and the second laser beam that are emitted from the optical integrated unit to illuminate an optical recording medium therewith, and also guides light reflected back from the optical recording medium into the optical integrated unit.

An optical recording medium drive device in accordance with the present invention is characterized in having the above described optical pickup incorporated therein.

The present invention as implemented above has the effects described below.

First of all, the present invention makes it possible to create an optical integrated unit in which a semiconductor laser array integrated of semiconductor lasers of different lasing wavelengths is mounted on top of a substrate, which can emit light beams of a plurality of wavelengths by reflecting them upward by a mirror, and detect light returned thereto.

The use of such an optical integrated unit makes it possible to implement an optical pickup which has a greatly reduced number of components and which is smaller, lighter, and more reliable with a greatly simplified optical system.

More specifically, the present invention enables a single optical axis adjustment because the same optical axis is used for each wavelength of the optical pickup. It is also not necessary to use any two-wavelength creation means such as a dichroic prism. In addition, it is sufficient to use one each of components such as the laser element and holographic element, so it is not necessary to assemble other components such as signal detector PDs and monitor PDs.

In other words, the present invention has the huge production advantage of enabling the implementation of an optical disk drive device that incorporates an optical integrated unit which is far smaller and lighter than in the prior art and which is also highly reliable with respect to mechanical vibration and shock.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 3A is a perspective view that includes divided PDs 35 and 36 and FIG. 3B is a schematic view illustrating how light is diffracted within each diffraction region;

FIG. 4A is a plan view thereof, FIG. 4B is a section taken along the line A—A of FIG. 4A, and FIG. 4C is a section taken along the line B—B of FIG. 4A;

FIG. 5A is an enlarged section through essential components thereof, FIG. 5B is a plan view, FIG. 5C is a section taken along the line A—A of FIG. 5B, and FIG. 5D is a section taken along the line B—B of FIG. 5B;

FIG. 11A is a plan view thereof and FIG. 11B is a section taken along the line A—A of FIG. 11A.

FIG. 12A shows an example of the mounting of the LD 31 on top of the isolation film 62 and FIG. 12B shows an example of the mounting of the LD 31 on top of the conductive layers 60A and 60B;

DETAILED DESCRIPTION OF THE PREFERRED EMBODIMENTS

Embodiments of the present invention will be described below with reference to the accompanying drawings.

Figure 1:
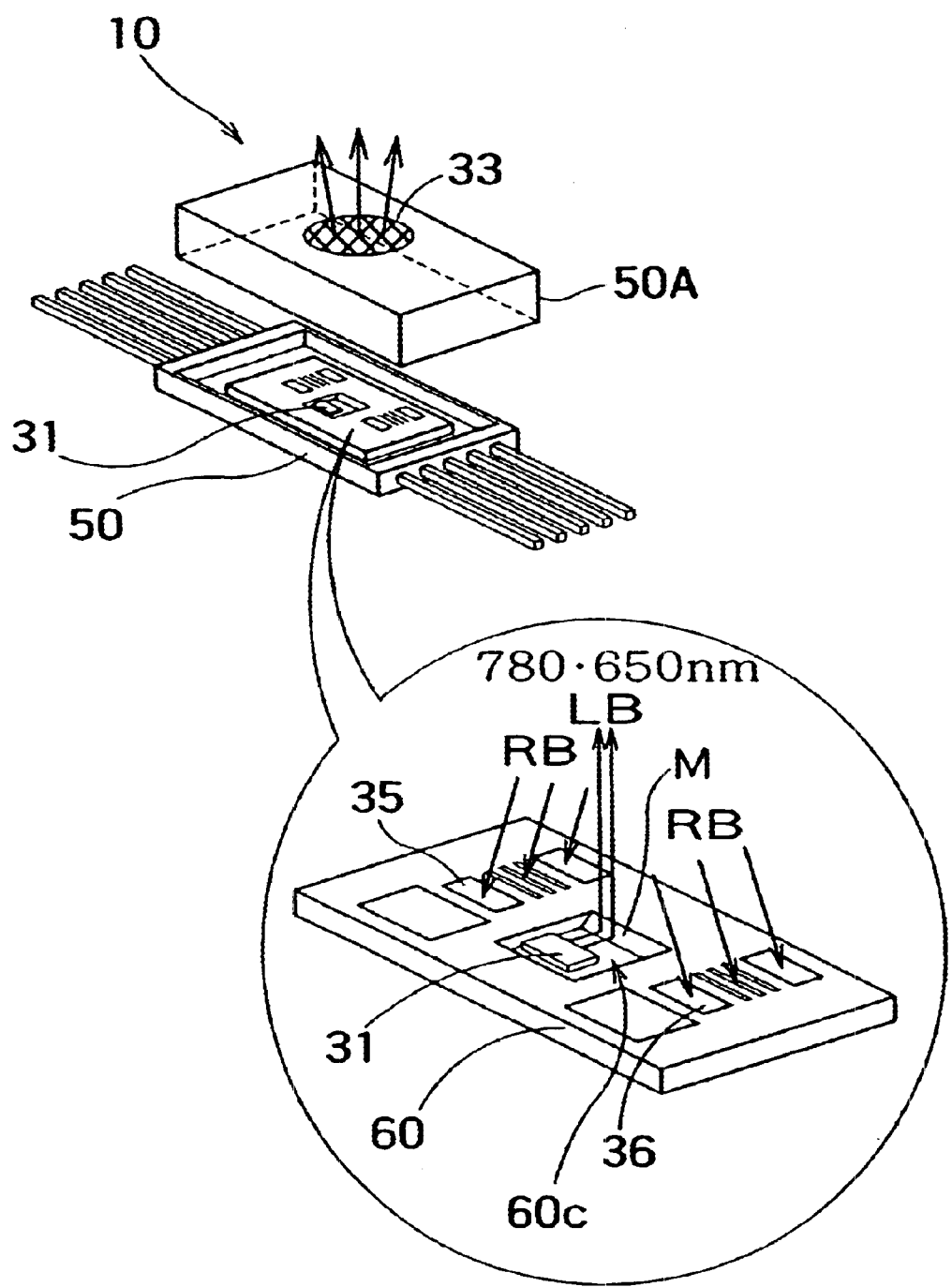
FIG. 1 shows schematic views of an optical integrated unit in accordance with the present invention, where an exploded perspective view of the assembly of essential components of an optical integrated unit in accordance with the present invention and an enlarged perspective view of the substrate portion are shown.
Figure 17:
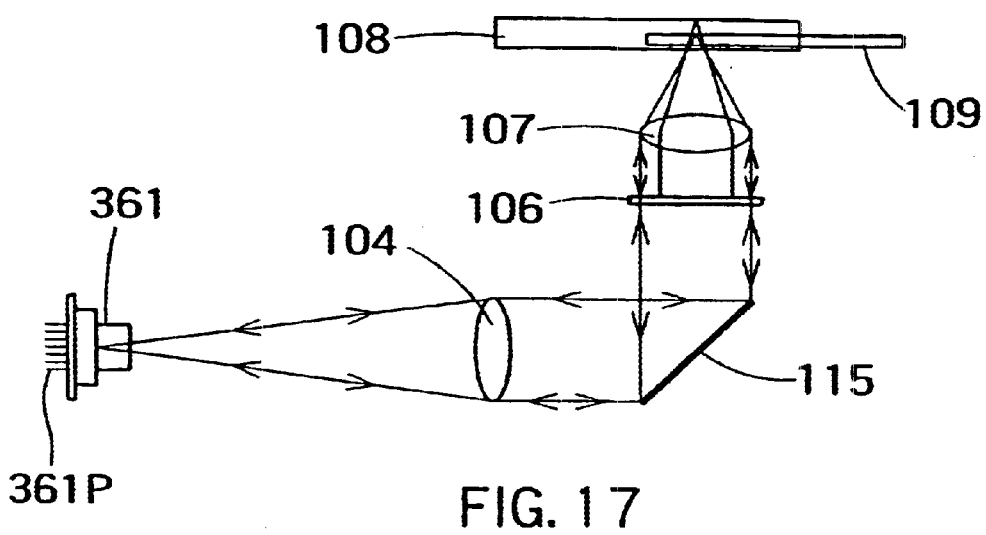
FIG. 17 is a schematic view of the optical system of the optical pickup used in the optical integrated unit of FIG. 16.

Conceptual views of an optical integrated unit in accordance with the present invention are shown in FIG. 1. In other words, an exploded perspective view of the assembly of essential components of an optical integrated unit in accordance with the present invention and an enlarged perspective view of the substrate portion are shown in the figure. An optical integrated unit 10 in accordance with the present invention is provided in the optical pickup of FIG. 17 instead of the optical integrated unit 361.

Essential components of the optical integrated unit 10 of this inventing are formed on a substrate 60 that is provided within a flat package 50.

Figure 15:
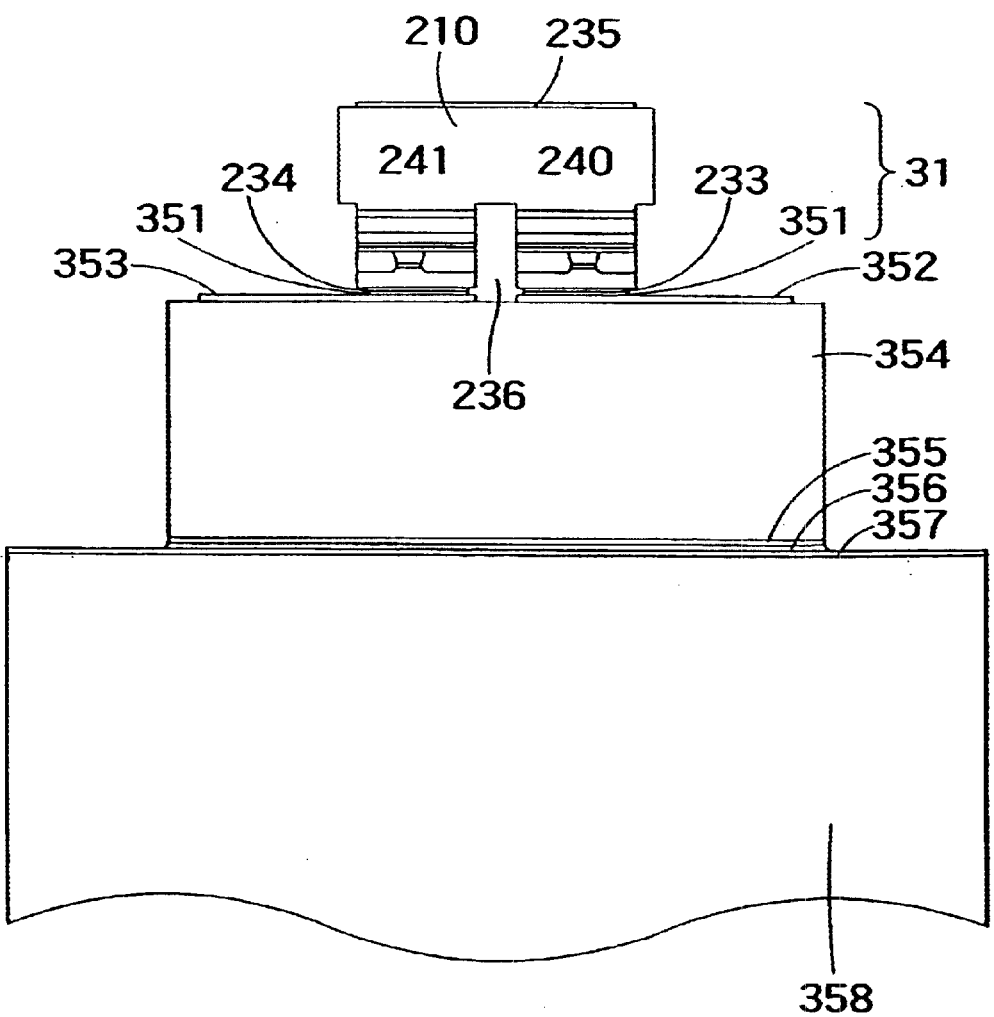
FIG. 15 is a schematic view of a section through the structure of the integrated semiconductor laser element proposed by the present inventor and others.

In other words, a concavity 60C is provided in a main surface of the substrate 60 and the LD 31 is mounted on a base surface thereof. The LD 31 is preferably a monolithic integrated semiconductor laser element such as that exemplified in FIG. 15. A DVD-format laser beam of a wavelength of 650 nm and a CD-format laser beam of a wavelength of 780 nm are emitted from this LD 31, by way of example.

The laser beams LB emitted from the LD 31 are reflected upward and outward by a mirror M formed on a side surface of the concavity 60C. These laser beams LB pass through a holographic optical element 33 and are incident on an optical disk through an optical system that is not shown in the figure. Light RB returning from the optical disk is diffracted by the holographic optical element 33 and is incident on divided detector photodiodes (PDs) 35 and 36 provided on the substrate 60. The holographic optical element 33 could be disposed on a lid portion 50A or the like, or an optical system that forms an optical pickup could be disposed somewhere separately from the optical integrated unit 10.

A silicon (Si) wafer or the like could be used as the substrate 60, by way of example, and a (111) plane formed therein by etching could be used as the mirror M. The divided detector PDs 35 and 36 could be formed by the provision of p-n junctions in a front surface portion of the substrate 60 made of silicon or the like.

Figure 2:
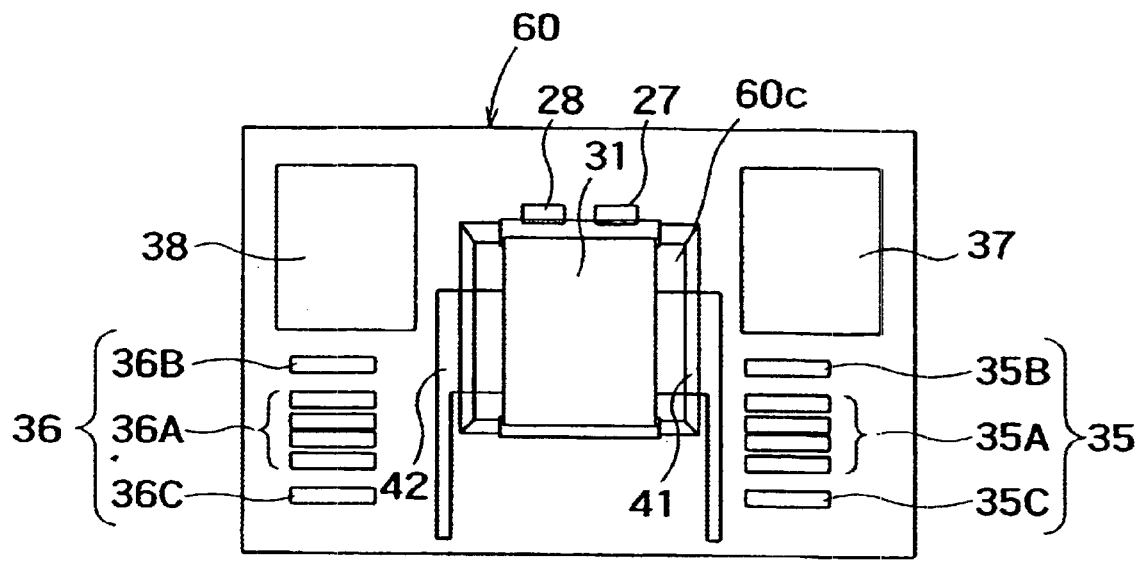
FIG. 2 is a schematic view of details of the planar configuration of a substrate 60 of an optical integrated unit 10.

A schematic view illustrating the planar configuration of the substrate 60 of the optical integrated unit 10 in detail is shown in FIG. 2. Wiring patterns 41 and 42 for driving the LDs are provided in the concavity 60C that is formed near the center of the substrate 60, and the LD 31 is mounted on top of those patterns. The wiring patterns 41 and 42 supply current signals for driving the 650-nm laser portion and the 780-nm laser portion of the LD 31.

Two PDs 27 and 28 for output monitoring are provided on a rear surface of the LD 31. The role of these monitor PDs 27 and 28 is to monitor the laser beams emitted from the 650-nm laser portion and the 780-nm laser portion of the LD 31 and send monitor signals to an output control circuit such as an auto power control (APC) circuit.

The divided PDs 35 and 36 for detecting RF signals and various errors are provided on either side of the concavity 60C in which the LD 31 is mounted. In other words, the role of the divided PDs 35 and 36 is to detect the beam reflected back from the optical disk as are signal and, at the same time, detect focusing errors and tracking errors of the laser beam on the disk.

Two amplifiers 37 and 38 are also formed on the substrate 60 to amplify and process the signals from the divided PDs 35 and 36 respectively.

Figure 3A:
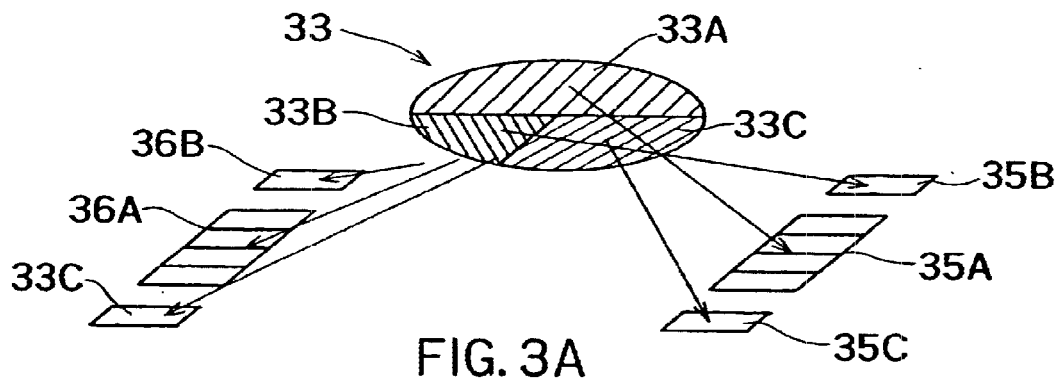
FIGS. 3A and 3B are schematic views of the paths of reflected light within the optical integrated unit 10 of the present invention, where
Figure 3B:
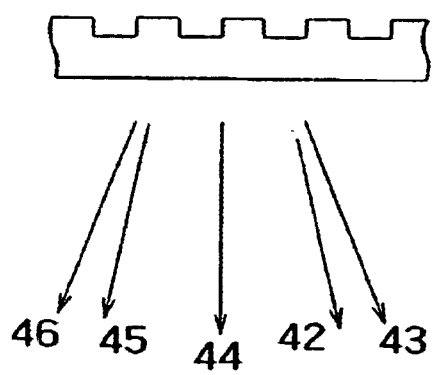

Schematic views of the paths of reflected light within the optical integrated unit 10 of the present invention are shown in FIGS. 3A and 3B, where FIG. 3A is a perspective view that includes the divided PDs 35 and 36 and FIG. 3B is a schematic view illustrating how light is diffracted within each diffraction region.

The holographic optical element 33 is divided into at least three regions and thus has diffraction regions 33A, 33B and 33C. These diffraction regions generate a straight-through component $I_0$, ±first-order diffracted light $I_1$, ±second-order diffracted light $I_2$, and so on, with respect to an incident light beam I.

The states in which light is diffracted by the holographic element are as shown in FIG. 3B. In other words, when laser beams of wavelengths 650 nm and 780 nm are emitted from the LD 31, the light that is reflected back from the disk is diffracted into each of the diffraction regions as shown in FIG. 3B. Note that only the zeroth-order and ±first-order components of the diffracted light are shown in FIG. 3B. In this case, first-order diffracted light beams 43 and 46 of the 780-nm wavelength have an angle of diffraction that is greater than first-order diffracted light beams 42 and 45 of the 650-nm wavelength.

Each of the divided PDs 35 and 36 is divided into six regions. Each has four partial regions 35A or 36A covering a central portion, an upper-end partial region 35B or 36B, and a lower-end partial region 35C or 36C.

As shown in FIG. 3A, positive first-order diffracted light from the diffraction region 33A that is due to the 650-nm-wavelength laser beam reflected back from the disk is arranged in such a manner that it is incident on the central portion of the divided PD35A in a completely focussed state. This makes is possible to use the "Foucault method" to detect focussing errors in the 650-nm laser beam.

In a "just-tracking" condition, the disposition is such that positive first-order diffracted light from the diffraction region 33B is incident on the central portion of the divided PD 35B and positive first-order diffracted light from the diffraction region 33C is incident on the central portion of the divided PD 35C. This makes it possible to detect tracking errors by the "push-pull method" or "two-element differential phase detection (DPD) method." In this case, the push-pull method is a method of seeking tracking information from a comparison of the strengths of diffracted light at the divided PDs 35B and 35C, and the two-element DPD method is a method of seeking tracking information from the phase difference between the diffracted light at the divided PDs 35B and 35C.

In these cases, it is not necessary to use the negative first-order diffracted light from the holographic optical element 33 exemplified in FIG. 3B.

The negative first-order diffracted light from the diffraction region 33A that is due to the 780-nm-wavelength laser beam reflected back from the disk is received by the central portion 36A of the left-hand divided PD 36. During this time, the positive first-order light beam 43 is incident on the right of the divided PD 35, but it is not necessary to use the divided PD 35.

There are two main classifications of methods used for detecting tracking errors on a CD-format disk by the 780-nm-wavelengthlaser beam.

The first method uses a "three-beam method." In other words, this method divides the 780-nm-wavelength laser beam into three beams (the zeroth-order light beam and the ±first-order light beams), shines them onto the disk, then detects the beams that are reflected back therefrom. In this case, "on-track" can be determined if the strength distribution of the side beams is symmetrical about the center beam. A holographic diffraction element could be used to divide the laser beams.

To implement this three-beam method in accordance with the present invention, the center beam reflected back from the disk is disposed in such a manner that it is diffracted by the diffraction region 33A and the negative first-order diffracted light beam is incident near the center of the central portion 36A of the divided PD 36. The left and right divided beams reflected back from the disk are each disposed in such a manner that it is diffracted by the diffraction region 33A and the negative first-order diffracted light beams thereof are incident near the center of the corresponding upper-end portion 36B and lower-end portion 36C of the divided PD 36. This configuration makes it possible to use the divided PD36 to detect tracking errors by the three-beam method.

Another method of detecting tracking errors uses the two-element DPD method or push-pull method that were described previously with reference to the 650-nm-wavelength beam. In such a case, the 780-nm-wavelength center beam reflected back from the disk is diffracted by each of the diffraction regions 33A to 33C of the holographic optical element 33. The negative first-order diffracted light from the diffraction region 33A is incident on the center of the divided PD 36A, the negative first-order diffracted light from the diffraction region 33B is incident on the center of the divided PD 36B, and the negative first-order diffracted light from the diffraction region 33C is incident on the center of the divided PD 36C. This makes it possible to detect tracking errors by the two-element DPD method or the push-pull method, in a similar manner to that with the 650-nm-wavelength laser beam.

In this case, the positions of the divided PDs 36B and 36C for the three-beam method are generally different from the positions of the divided PDs 36B and 36C for the two-element DPD method. In addition, since the angles of diffraction from the holographic optical element are different for the 650-nm wavelength and the 780 wavelength, the positions at which the divided PDs are disposed on either side of the LD 31 will not be symmetrical about the LD 31, even when tracking error is done by using the two-element DPD method and the push-pull method.

As described above, this embodiment of the invention makes it possible to create an optical integrated unit that is far thinner, smaller, and lighter than in the prior art, by using a configuration in which an integrated semiconductor laser element is mounted on a substrate and a mirror is used to fold laser beams therefrom into the perpendicular direction.

The present invention also makes it possible to accurately detect laser beams of wavelengths 650 nm and 780 nm and not only read RF signals as data, but also detect focussing errors and tracking errors in a simple and reliable manner, by the use of a holographic optical element in which a diffraction region is divided into three parts and a divided PD is disposed on the substrate in such a manner that first-order diffracted light obtained from each diffraction region is received thereby.

In particular, since a common holographic optical element is used for laser beams of two different wavelengths, it is possible to make the optical system much simpler and smaller, reduce fabrication costs, and also improve the reliability thereof.

Specific examples of the configuration of the optical integrated unit 10 of this embodiment of the invention will now be described in detail.

The description first concerns the mount portion for the LD 31.

Figures 4A, 4C:
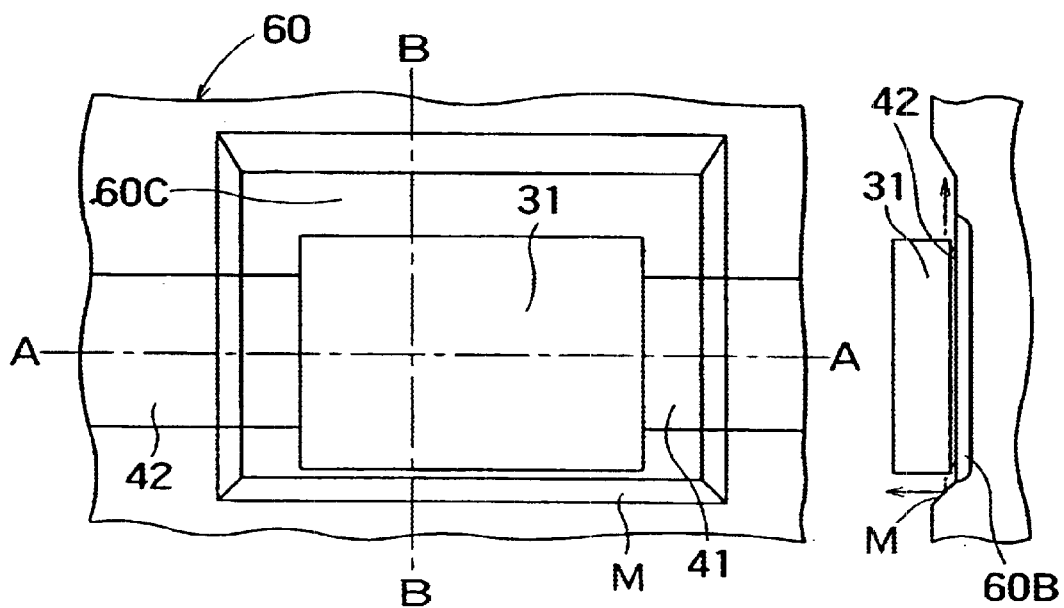
FIGS. 4A through 4C are schematic views of essential components of the mount portion of the LD 31, where
Figure 4B:
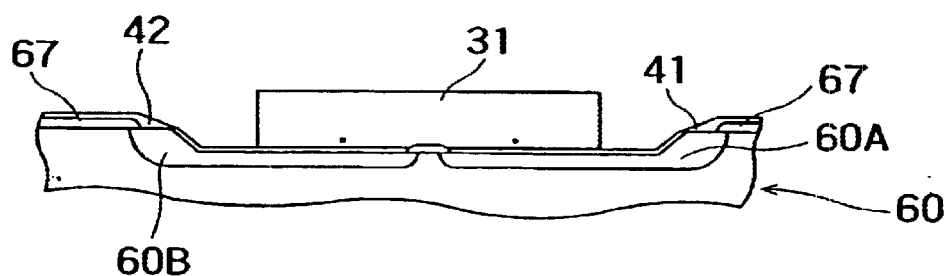

Schematic views of essential components of the mount portion of the LD 31 are shown in FIGS. 4A through 4C, where FIG. 4A is a plan view thereof, FIG. 4B is a section taken along the line A—A of FIG. 4A, and FIG. 4C is a section taken along the line B—B of FIG. 4A. The mirror M is formed at an angle of 45° on the substrate 60 in order to reflect the laser beams emitted from the LD 31 at approximately 90°, and the two-wavelength LD 31 is mounted on a base surface side of that mirror M.

Divided conductive layers 60A and 60B could be formed on the substrate 60 below the surface on which the LD 31 is mounted, to provide electrical isolation between the two laser excitation portions that are integrated within the LD 31.

If the substrate 60 is formed of silicon (Si), the conductivity of that substrate portion is often made to be p-type for the formation of an IC circuit for current amplification in the substrate 60. In such a case, n-type regions are formed as the conductive layers 60A and 60B. This configuration makes it possible to separate the conductive layers 60A and 60B electrically. Note that reference number 67 in this figure denotes an isolation layer.

The wiring patterns 41 and 42 are formed of a material such as gold (Au) or titanium (Ti) over the thus configured conductive layers 60A and 60B, then the integrated semiconductor laser diode 31 is mounted thereupon. The two laser excitation portions of the LD31 are electrically isolated by a separation groove or the like, as shown by way of example in FIG. 15, so that the electrodes (such as p-side electrodes) 233 and 234 thereof can be connected to the wiring patterns 41 and 42.

If the IC circuitry for driving the LD is to be formed on top of the substrate 60, the connections between this circuitry and the parallel wiring patterns 41 and 42 could be done beforehand. If no IC circuitry for driving the LD is to be formed on top of the substrate 60, electrode pads for external connections could be formed at the ends of the wiring patterns 41 and 42.

An electrode (such as an n-side electrode) 235 on the opposite side of the two-wavelength LD 31 is a common electrode. It should be obvious to those skilled in the art that all the conductivity types relating to the LD 31 could be reversed with no problems.

Figure 5A:
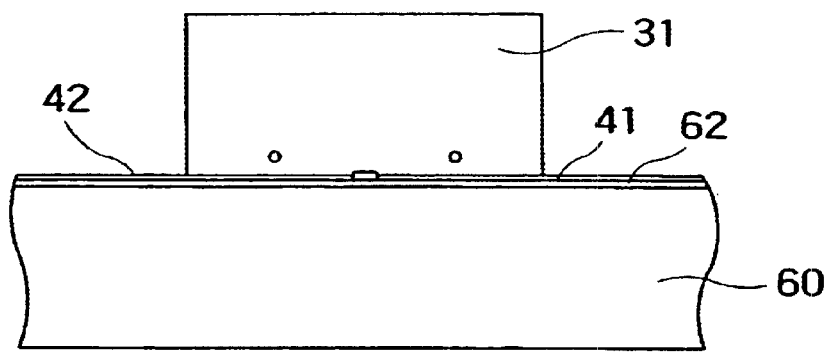
FIGS. 5A through 5D show variant example of the mount portion of the LD 31, where
Figures 5B, 5C:
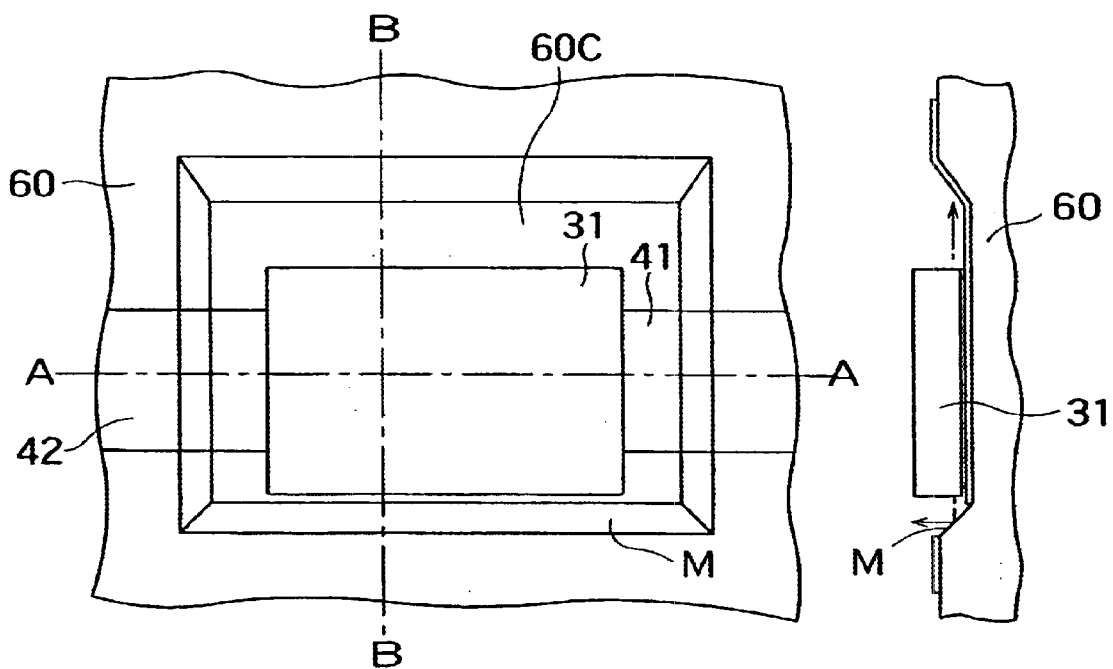
Figure 5D:
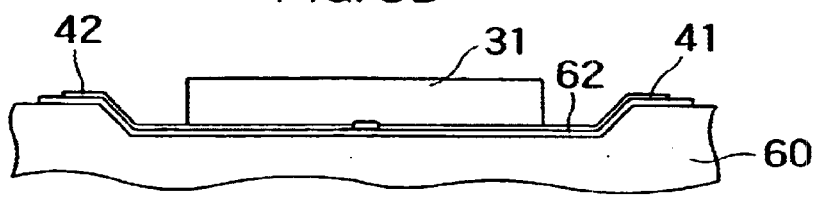

A variant example of the mount portion of the LD 31 is shown in FIG. 5, where FIG. 5A is an enlarged section through essential components thereof, FIG. 5B is a plan view, FIG. 5C is a section taken along the line A—A of FIG. 5B, and FIG. 5D is a section taken along the line B—B of FIG. 5B.

In the variant shown in these figures, an isolation film 62 of a material such as silicon nitride ($SiN_x$) or silicon dioxide ($SiO_2$) is formed by plasma chemical vapor deposition (CVD) or sputtering on the front surface of the substrate 60, to provide electrical isolation. The wiring patterns 41 and 42 are subsequently formed on the isolation film 62, then those wiring patterns are connected by a high-melting-point metal such as an AuSn eutectic crystal to the electrodes 233 and 234 of the two-wavelength LD 31.

This variant has the advantage of not requiring the processing for forming the conductive regions 60A and 60B, as shown in FIG. 4C.

The description now turns to a specific example of improving the efficiency with which light is extracted from the LD 31.

Figure 6:
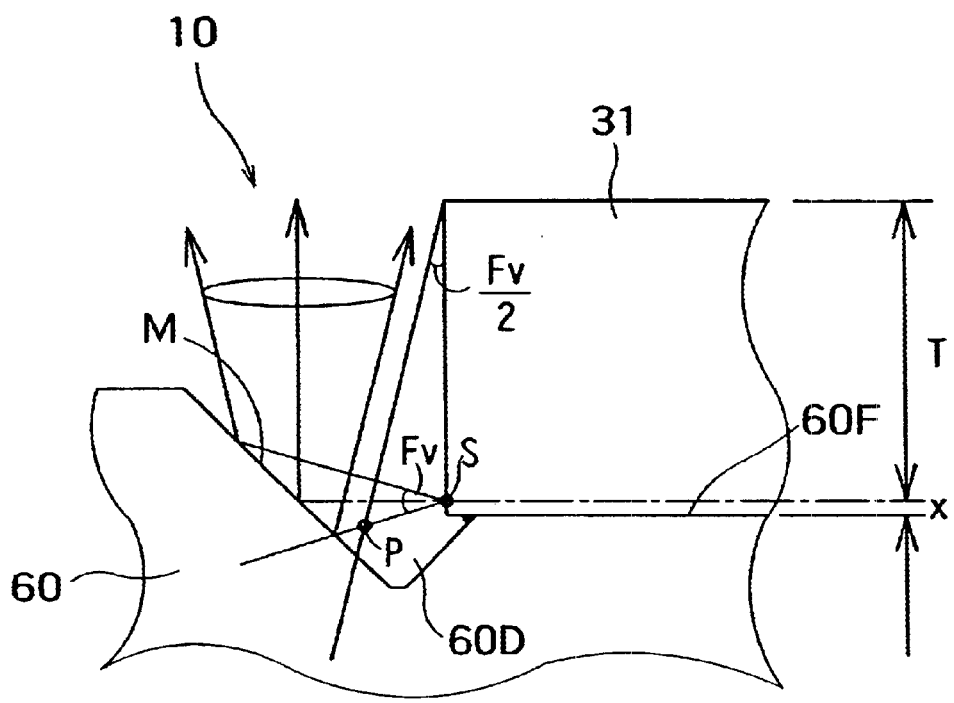
FIG. 6 is an enlarged section through essential components of a portion of the mirror M.

An enlarged section through essential components of a portion of the mirror M is shown in FIG. 6.

The 650-nm-wavelength laser excitation portion of the LD 31 has less leeway in its thermal characteristics than the 780-nm-wavelength excitation portion. For that reason, it is necessary to ensure that the luminous spot S of the laser beam is disposed close to the substrate 60 to increase the thermal dissipation characteristics thereof. This is called "upside-down mounting."

If the LD 31 is mounted upside-down on the substrate 60, however, a problem occurs in that the laser beam emitted in a radiating pattern therefrom will be "obstructed" by a base surface 60F of the substrate or the end surface of the laser, in other words, it will be obstructed thereby.

Figure 7A:
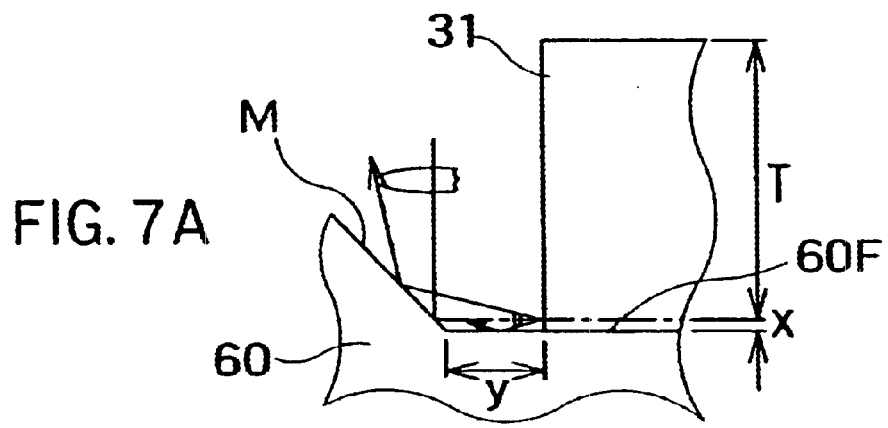
FIGS. 7A through 7C are schematic views illustrating the problem of "obstruction;"
Figure 7B:
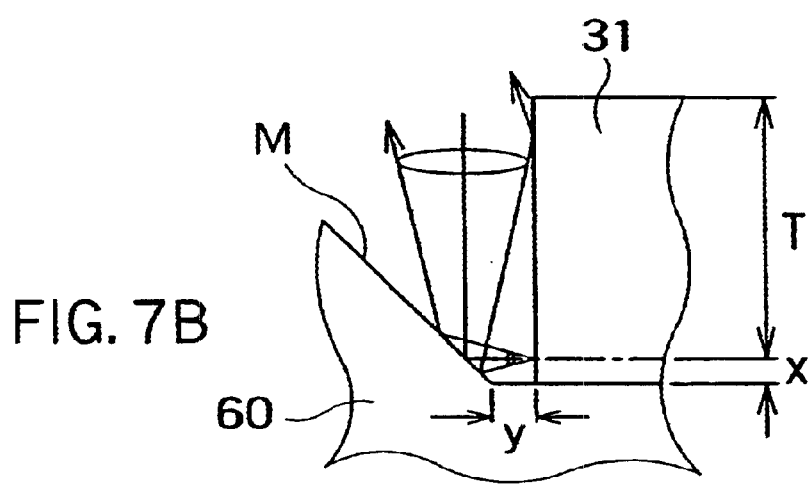
Figure 7C:
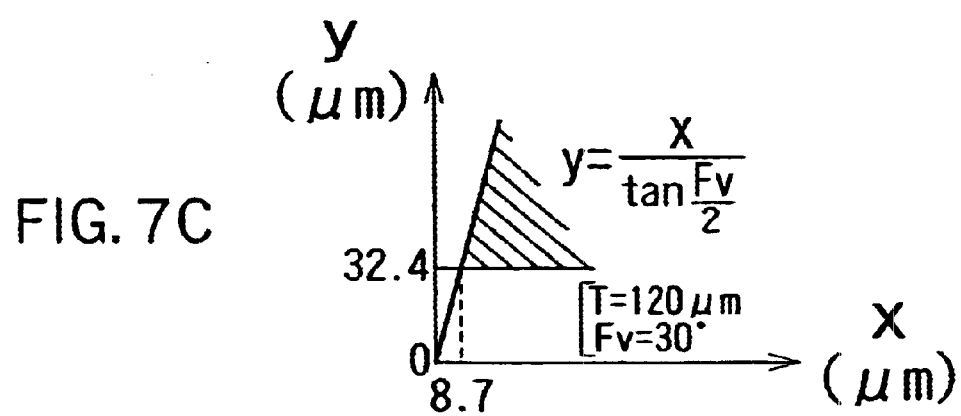

Schematic views illustrating this problem are shown in FIGS. 7A to 7C, where FIG. 7A is an simplified section through the structure of essential components of the optical integrated unit when the height x of the luminous spot of the laser beam is small. As can be seen from this figure, if x is small, the downward-orientated part of the laser beam emitted from the LD 31 will strike against the base surface 60F of the substrate. One method that could be considered to ensure that the laser beam is not obstructed by the base surface 60F of the substrate is to reduce the distance y between the LD 31 and the mirror M.

A simplified section through the structure of the essential components of the optical integrated unit when y is made small in this manner is shown in FIG. 7B. As can be seen from this figure, if y is small, part of the laser beam that is reflected by the mirror M will strike against the end surface of the LD 31. In such a case, the thickness T of the LD 31 is often on the order of 100 to 150 microns. If this thickness T is reduced, the reflected light will not be "obstructed" thereby, but this will make handling extremely difficult during the fabrication and assembly processes, so it is difficult in practice to make this thickness very small.

From geometrical analysis of the paths of the laser beams in FIGS. 7A and 7B, it can be seen that the condition for preventing "obstruction" of the laser beam by the base surface 60F of the substrate can be expressed by:

$$y \times \tan(Fv/2) < x \quad (1)$$

Similarly, the condition for preventing "obstruction" of the reflected light by the end surface of the laser, as shown in FIG. 7B can be expressed by:

$$T \times \tan(Fv/2) < y \quad (2)$$

A graph that exemplifies the region wherein these conditions are satisfied is shown in FIG. 7C, where x is plotted along the horizontal axis, y is plotted along the vertical axis, and the hatching in the graph shows the region wherein Equations (1) and (2) are satisfied for a laser with a thickness T of 120 μm and a perpendicular angle of expansion Fv of 30°, by way of example. It can be seen from this graph that it is necessary to ensure that the height x of the luminous spot is at least 8.7 μm and the distance y from the mirror is at least 32.4 μm.

It is, however, difficult to raise the height x of the luminous spot to at least 8.7 μm with a DVD-format laser. This is because it is preferable to ensure that x is no more than 5 μm for a DVD-format laser, as mentioned previously. This is a particular disadvantage for a rewritable DVD-RAM which requires a high level of output of at least 30 mW. It is therefore difficult to implement a DVD-format optical pickup by using a prior-art optical integrated unit.

In contrast thereto, if an excavated concavity 60D is provided in the substrate between the mount portion of the LD 31 and the mirror M, the laser beam emitted from the luminous spot S will reach the mirror M without being "obstructed" by the base surface 60F of the substrate, and also the beam reflected therefrom is prevented from being "obstructed" by the end surface of the LD 31.

Note that a silicon wafer in which the main surface is a surface inclined at 9.7° to the [111] direction from the (100)plane could be used for forming the mirror inclined at 45° to the substrate surface, by way of example. With such a configuration, the (111)plane that is inclined at 45° to the main surface of the substrate could be used as the mirror M, making it simple to form the (111) mirror surface by etching.

The positional relationships between the components in this specific example are as described below in more detail. In other words, the mirror M must be formed as far as a line extending downward at an angle of (Fv/2) from the luminous spot S. This ensures that the laser beam is not "obstructed" by the base surface 60F.

If a line is projected downward at an angle of (Fv/2) from the upper edge of the light-emitting surface of the LD 31, an intersection point P with the line extended downward at an angle of (Fv/2) from the luminous spot S is obtained. The mirror M must be provided at some distance from the intersection point P, as seen from the LD 31. This ensures that the reflected light is not "obstructed" by the end surface of the LD 31.

In other words, the present invention ensures that the laser beam does not strike the base surface 60F and the reflected light does not strike the end surface of the LD 31, even if the luminous spot S is close to the base surface 60F of the substrate.

As a result, it becomes possible to mount a short-wavelength laser such as an InGaP/InGaAlP or GaN/InGaN semiconductor laser in the "upside-down" orientation, in other words, with the active layer side thereof mounted on the silicon substrate, as in this specific example. This also ensures that it is possible to maintain the radiation characteristics sufficiently, thus meeting the requirement of the operating temperature range that is required of the system.

This specific example also ensures that there is no increase in the number of components of the optical integrated unit, in comparison with the prior art. If, for example, a material such as a heat sink is interposed between the substrate 60 and the LD 31, there is a danger that the number of components will increase and the assembly precision will deteriorate. If the precision required of the angle of the optical axis between the DVD format and the prior-art CD format is compared in such a case, a CD requires ±2° whereas a DVD requires ±0.5°. The permitted precision of the relative positions of the LD 31 and the light-receiving element is ±20 μm for a CD and ±5 μm for a DVD. In other words, a DVD device requires approximately four times the precision of a CD device. It would therefore be technically difficult to manufacture a DVD device with a high level of yield if the number of components of the optical integrated unit were to increase and the assembly precision thereof were to deteriorate. However, the present invention ensures that the LD 31 can be mounted directly on the substrate 60, with no change in the number of components from the prior art, thus enabling high-precision assembly.

In the specific example shown in FIG. 6, the light-emitting end of the LD 31 could be mounted so as to protrude by a small amount into the concavity 60D. This is because it is necessary to ensure that the luminous spot of the DVD-format short-wavelength laser is as close as possible to the base surface 60F of the substrate, to maintain the thermal radiation characteristics thereof, and, as a result, the "solder" used for mounting the LD 31 could have adverse effects thereon.

Figure 8:
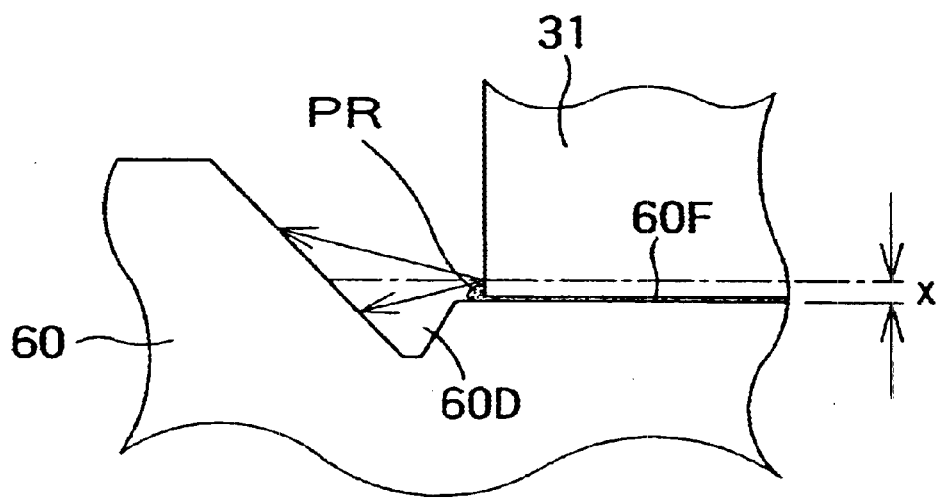
FIG. 8 is a section illustrating a state in which "solder" protrudes.

A section though this structure in such a state is shown in FIG. 8, in which the LD 31 is mounted at some distance from the concavity 60D. In such a case, a "solder" of a material such as gold, tin alloy, or indium is often used when mounting the LD 31. If the solder juts out as shown in this figure and forms the protrusion PR, the p-n junction of the laser will be short-circuited or the laser beam may be obstructed by the protrusion PR.

In contrast thereto, short-circuiting of the p-n junction and obstruction of the laser beam can be suppressed by making the LD 31 protrude slightly above the concavity 60D as shown in FIG. 6, so that such adverse effects can be prevented even if the unit is made to operate for a long period of time.

In this case, the protruding portion of the laser is not in direct contact with the silicon substrate, so the thermal radiation characteristics thereof will worsen. If this protrusion is too great, therefore, the temperature characteristics of the laser will deteriorate. Experiments performed by the present inventor has shown that it is preferable that this protrusion is within the range of 0 to 20 μm for as InGaP/InGaAlP or GaN/InGaN semiconductor laser.

Figure 9:
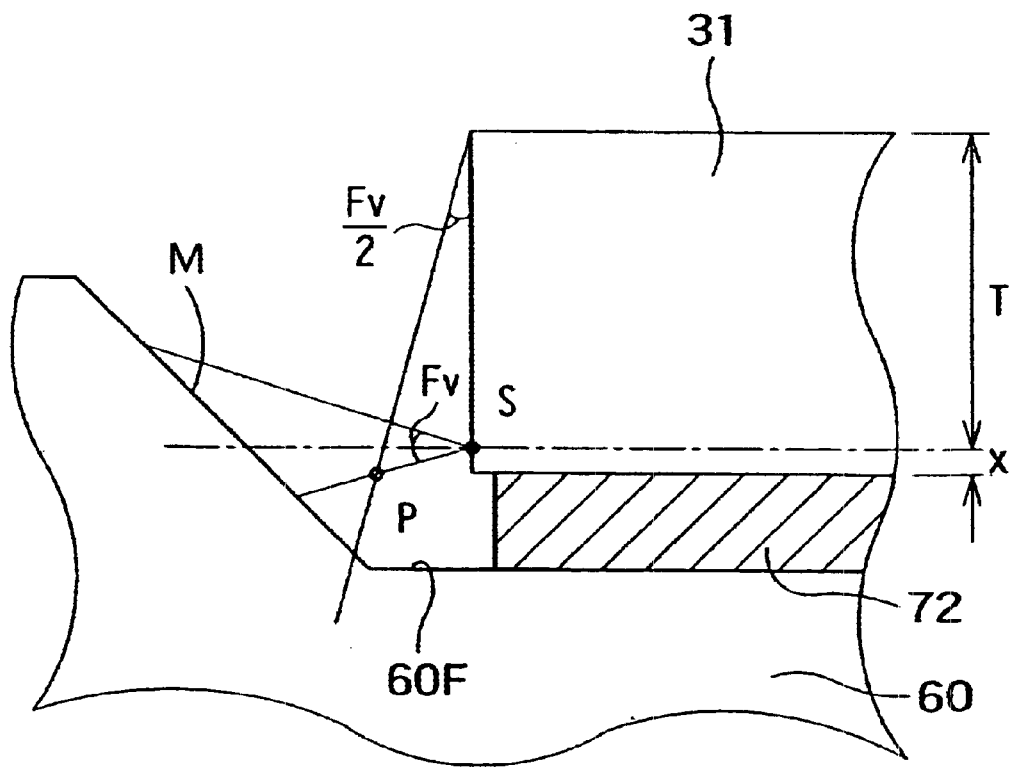
FIG. 9 is an enlarged section through essential components of another variant example of the LD mounting portion of the optical integrated unit 10 in accordance with the present invention.

An enlarged section through essential components of another variant example of the LD mounting portion of the optical integrated unit 10 in accordance with the present invention is shown in FIG. 9, in which a heat sink 72 is provided on top of a stepped portion provided in the substrate 60 and the LD 31 is mounted thereon. This raising of the position of the LD 31 makes it possible to prevent obstruction of the laser beam by the base surface 60F and also prevent obstruction of the light reflected from the mirror M due to the end surface of the laser.

The heat sink 72 in this case preferably has a good coefficient of thermal conductivity, so suitable materials therefor could be copper, molybdenum, COVAR, silicon, aluminum nitride, or diamond. If the heat sink 72 is made of a separate member from the substrate 60, technical problems may arise. In other words, handling and assembly will be difficult if the thickness of a heat sink made of one of the above materials is 100 μm or less. If the heat sink is thicker than that, on the other hand, it will be necessary to etch the stepped portion of the substrate 60 to an even greater depth, and control over the etching depth will no longer be simple.

If the heat sink 72 and the substrate 60 are made of separate members in this manner, fabrication will no longer be simple. It is therefore preferable to form the heat sink 72 as a thin film that is deposited on top of the base surface 60F of the substrate 60. One of the above mentioned materials could be deposited very precisely to a predetermined film thickness on top of the base surface 60F of the substrate by a method such as vapor deposition, sputtering, CVD, or plating, by way of example.

This variant example also makes it possible to solve the problem of obstruction of the laser beam and shorting of the p-n junction by the solder used for mounting, by mounting the LD 31 so that it protrudes slightly with respect to the heat sink 72, in a similar manner to that described above with reference to FIG. 6.

Figure 10A:
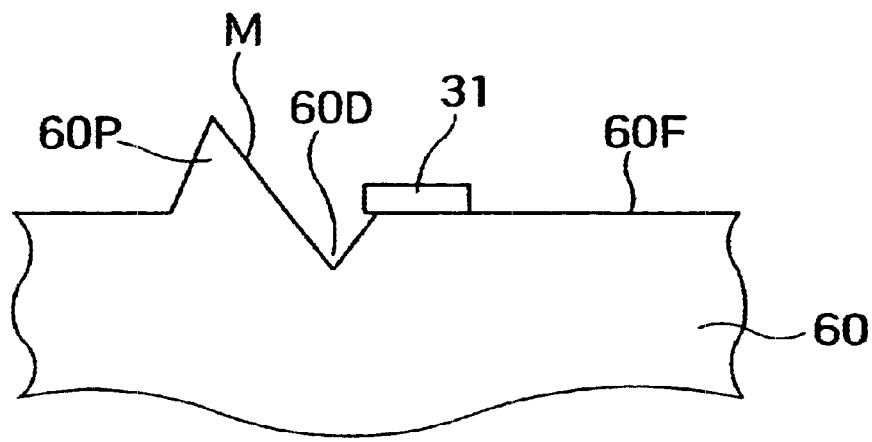
FIG. 10A is an enlarged section through essential components of a further variant example of the LD mounting portion of the optical integrated unit 10 in accordance with the present invention and FIG. 10B is a perspective view of yet another variant example thereof.

An enlarged section through essential components of a further variant example of the LD mounting portion of the optical integrated unit 10 in accordance with the present invention is shown in FIG. 10A, in which a convex portion 60P is formed on the main surface of the substrate 60 and an inclined surface thereof forms the mirror M. The concavity 60D is also provided and the mirror M extends into this concavity 60D. The LD 31 is mounted on a main surface 60F.

Figure 10B:
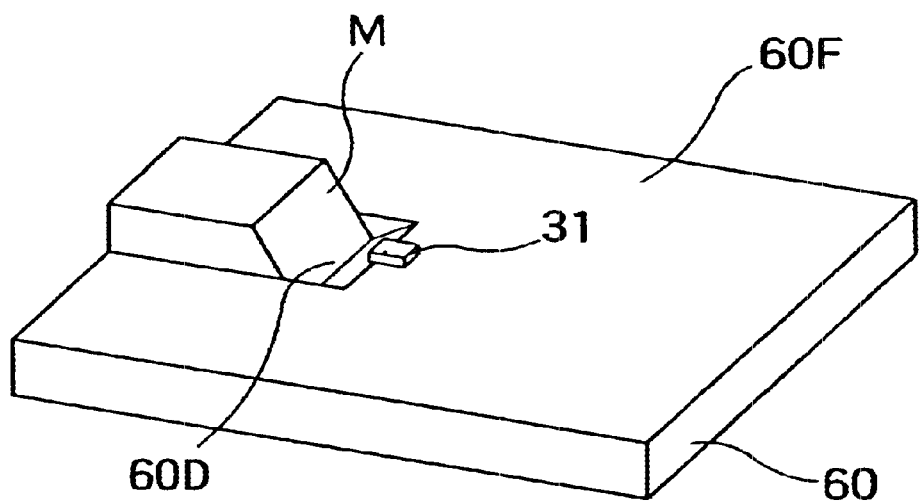

In the specific example shown in FIG. 10B, on the other hand, a step is formed in accordance with the stepped portion behind the mirror M of the substrate 60. The mirror M is formed to extend into the concavity 60D. The LD 31 is mounted on top of the main surface 60F of the substrate 60.

Since the concavity 60D is provided in the specific examples shown in FIG. 10, the laser beam emitted from the LD 31 is reflected by the mirror M and thus can be extracted efficiently, without striking the main surface 60F of the substrate. Effects similar to those obtained by the configuration of FIG. 6 can therefore be obtained.

The description now turns to the monitor PDs of the LD 31.

Figure 16:
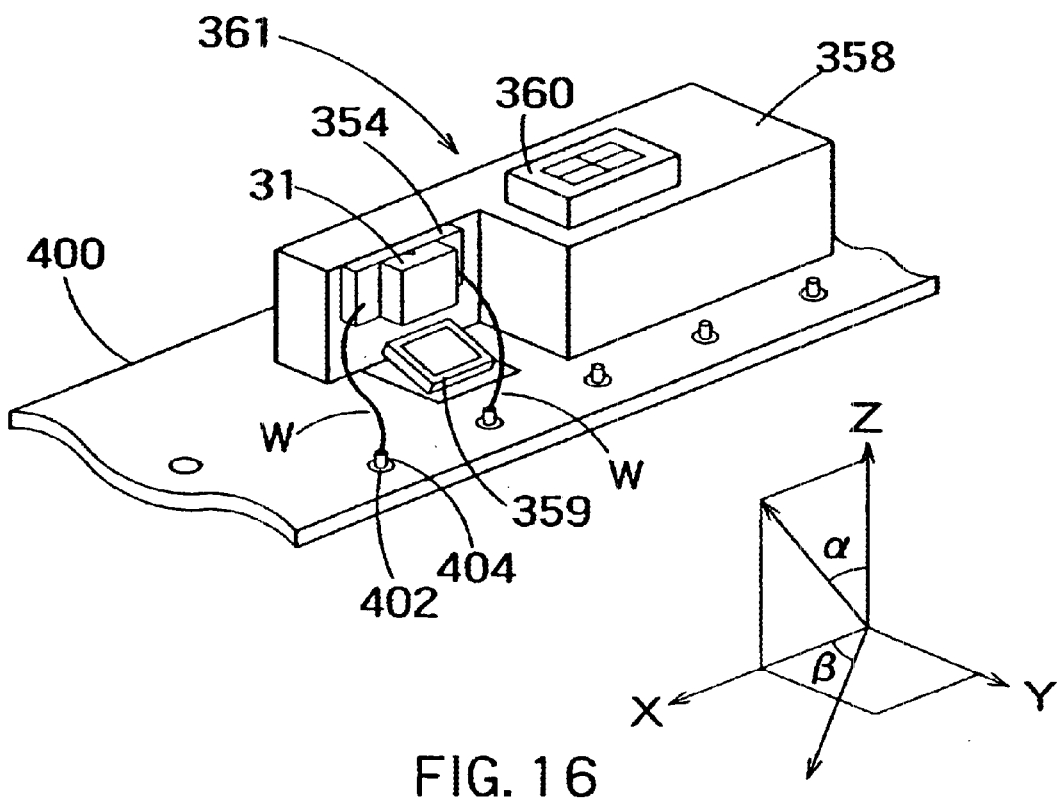
FIG. 16 is a perspective view of essential components of an optical integrated unit in which an integrated semiconductor laser element is mounted in a CAN-type package.

As previously mentioned with reference to FIG. 16, a PD for monitoring the optical output is provided at a location that is separated by several hundred μm to several mm from each laser element. In such a case, one monitor PD can be used in common for an integrated semiconductor laser element that emits a plurality of laser beams.

In contrast thereto, the use of a substrate of silicon (Si) or the like in accordance with the present invention makes it possible to provide the monitor PD in close proximity to the LD 31.

Figure 11A:
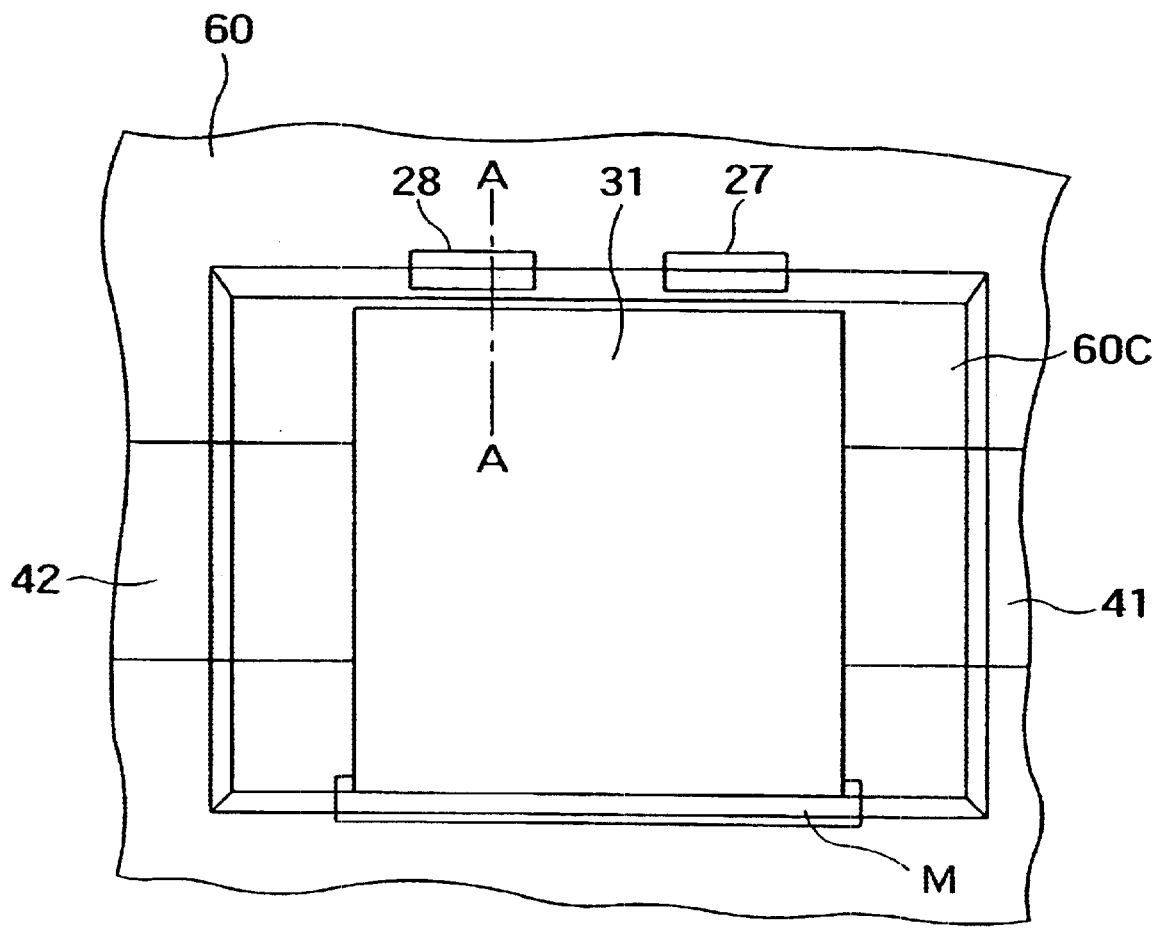
FIGS. 11A and 11B show enlarged views of essential components of the mounting portion of the LD 31, where
Figure 11B:
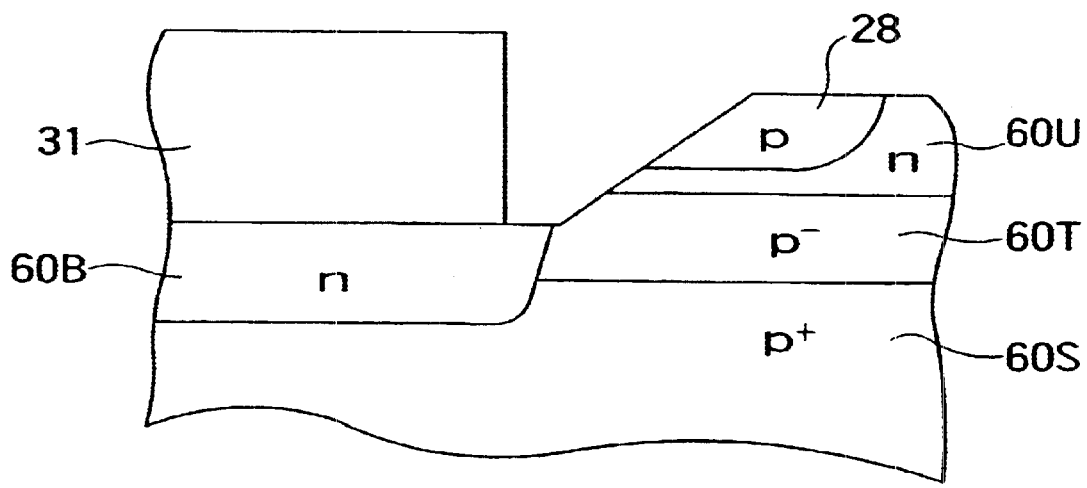

Enlarged views of essential components of the mounting portion of the LD 31 are shown in FIGS. 11A and 11B, where FIG. 11A is a plan view thereof and FIG. 11B is a section taken along the line A—A of FIG. 11A.

The monitor PDs 27 and 28 are provided facing an end surface on the rear side of the LD 31. These PDs 27 and 28 can monitor the laser beams that are emitted from the rear ends of the two laser excitation portions of the LD 31, in an independent manner.

The monitor PDs 27 and 28 can be formed of p-n junctions on stepped portions of the substrate. If the substrate 60 is formed of a silicon (Si) wafer, by way of example, it is convenient to use a p+-type wafer 60S therefor, as shown in FIG. 11B. In such a case, a p−-type layer 60T and an n-type layer 60U are deposited in sequence on top of the p+-type wafer 60S.

In the substrate of this multi-layer configuration, the monitor PDs 27 and 28 could be formed by providing p-type regions in a stepped portion of the n-type layer 60U. Each of these PDs is then connected to wiring (not shown in the figure) and outputs to an amplifier provided on the substrate.

It should be obvious to those skilled in the art that the configuration could be such that all the conductivity types of the layers are regions are reversed.

This specific example of the invention makes it possible to integrate the monitor PDs in an accurate and also simple manner, by forming p-n junctions on a stepped portion of a concavity formed in the substrate. As a result, it is not necessary to mount a monitor PD in alignment with the optical axis of the LD, as in the prior art. This reduces the labor involved with assembly and also makes it difficult for misalignment with the optical axis to occur.

The present invention also makes it possible to provide an independent monitor PD for each of the plurality of laser excitation portions formed in the integrated semiconductor laser element. It is therefore possible to supply a monitor output directly to a dedicated output control circuit for each laser excitation portion, without having to use a switching means. In other words, the output of each of the laser excitation portions can be controlled independently.

The description now turns to the integrated circuit portions and electrode connection portions provided on the substrate.

Figure 12A:
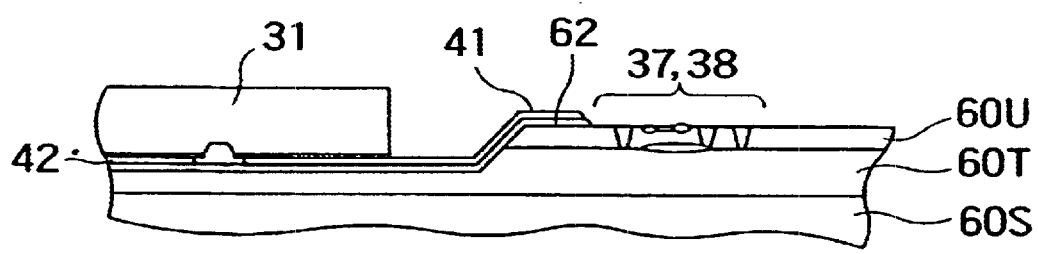
FIGS. 12A and 12B show sections through essential components of the substrates of specific examples, taken in the direction perpendicular to the optical axis of the LD 31, where
Figure 12B:
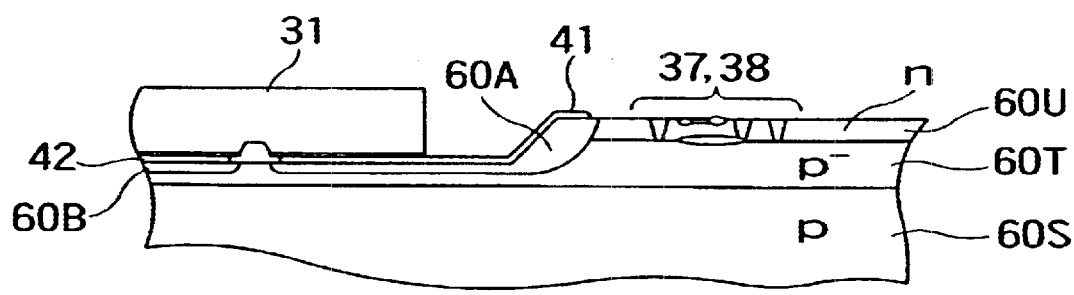

Sections through essential components of the substrates of these specific examples are shown in FIG. 12. In other words, these are sections taken in the direction perpendicular to the optical axis of the LD 31, where FIG. 12A shows an example of the mounting of the LD 31 on top of the isolation film 62 and FIG. 12B shows an example of the mounting of the LD 31 on top of the conductive layers 60A and 60B.

By using a semiconductor wafer of silicon (Si) or the like as the substrate 60, the present invention makes it possible to incorporate various functions such as those of the previously described divided PDs 35 and 36 for signal detection, a bent mirror M, the electrode separation structure for the integrated LD 31, and the independent integrated monitor PDs 27 and 28.

In addition, IC circuits 37 and 38 can be integrated into the substrate 60 as IV-amplifiers for amplifying the extremely weak currents from the divided PDs 35 and 36 and the monitor PDs 27 and 28.

As shown by way of example in FIG. 12, each of these IC regions is within the epitaxially grown layers 60T and 60U on the front surface of the substrate 60. The depth of each layer is generally within a few $\mu$m from the front surface of the substrate.

On the other hand, the depth of the concavity 60C for mounting the LD 31 must be at least 10 $\mu$m to allow for the formation of the mirror M. It is therefore necessary to form the divided conductive layers 60A and 60B, which are formed on the electrode connection portions of the LD 31, at a deeper position. This could be implemented during the process of forming the IC circuits 37 and 38 at a stage before the concavity 60C is formed, by introducing an n-type impurity into the substrate 60 by a method such as ion implantation, diffusion, or burying epitaxial growth.

The description now turns to an optical recording medium drive device in accordance with the present invention.

Figure 13:
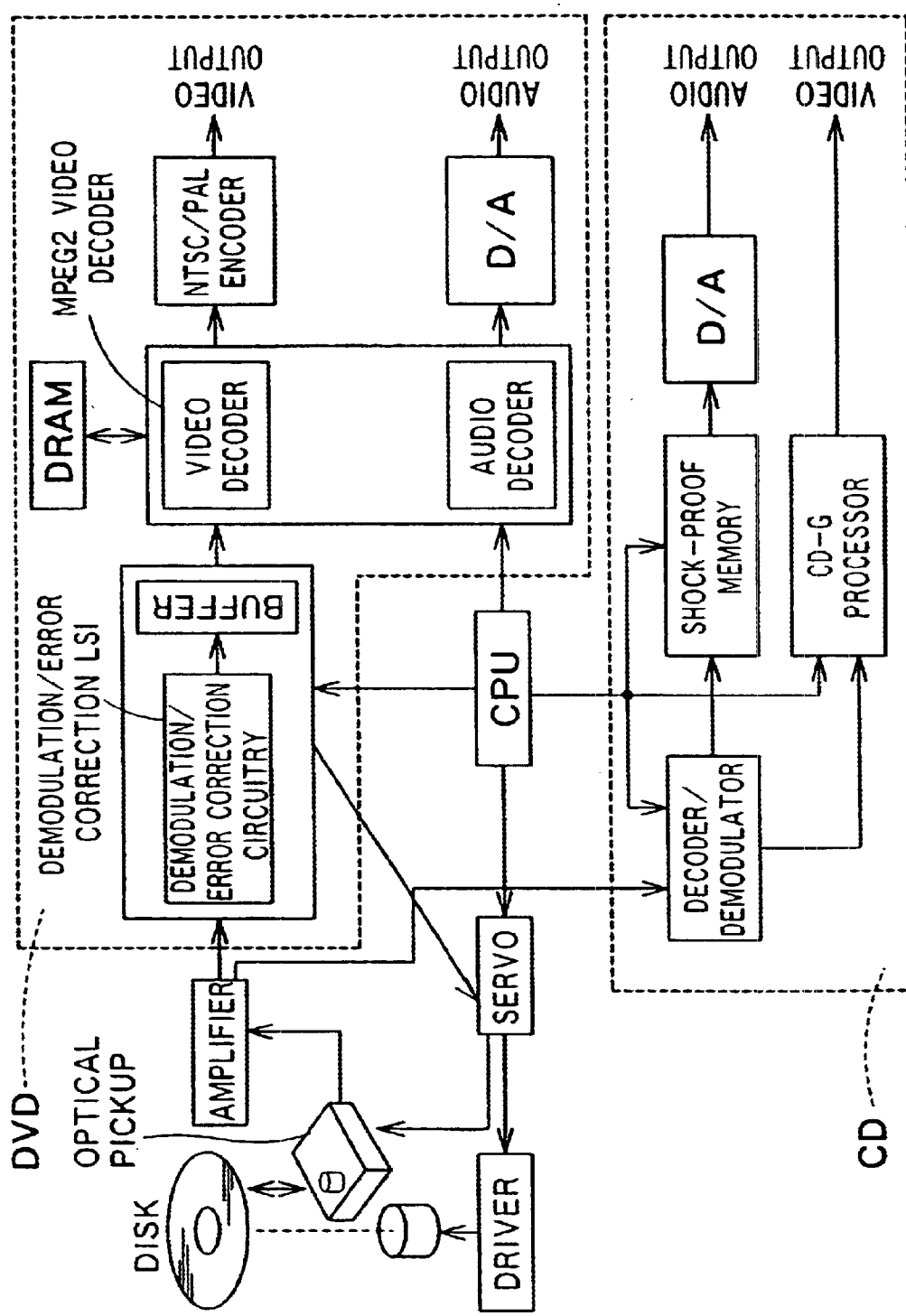
FIG. 13 is a block diagram of an optical recording medium drive device in accordance with the present invention.
Figure 14:
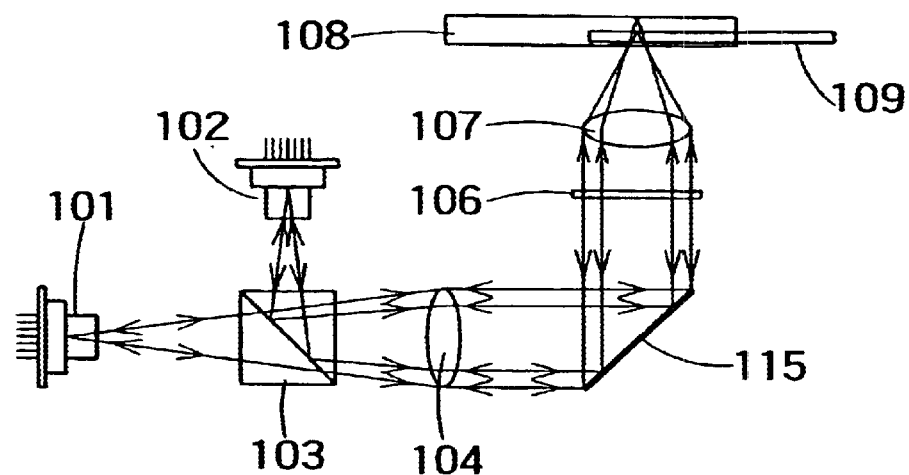
FIG. 14 is a schematic view of the configuration of a conventional two-light-source type of optical pickup for DVD.

A block diagram of the optical recording medium drive device of this invention is shown in FIG. 13. The present invention makes it possible to provide a small, light-weight optical disk drive device that an play both DVD-format disks and CD-format disks, by way of example, by using an optical pickup that incorporates one of the optical integrated units described above with reference to FIGS. 1 to 12.

The device shown in FIG. 13 is an optical disk drive device which is capable of driving DVD-ROM-format disks and CD-format disks and which has both a DVD-format signal processing system and a CD-format signal processing system.

A DVD-format or CD-format optical disk is rotated at a predetermined rotational speed by a driver. The optical pickup is moved to a predetermined position by servos. This optical pickup incorporates one of the optical integrated units described with reference to FIGS. 1 to 12. It is preferable to use an integrated semiconductor laser array such as that described with reference to FIG. 15 as the light source thereof.

A signal recorded on the disk is detected by this optical pickup. During this time, the device determines whether the disk is a DVD-format disk or a CD-format disk and uses light from a predetermined light source therefor.

The detected signal is supplied to either the DVD-format signal processing system or the CD-format signal processing system, depending on whether this is a DVD-format disk or a CD-format disk.

Taking the description of the DVD-format signal processing first, the signal detected by the optical pickup is demodulated in accordance with decoding rules and error correction is applied. Images and sound are then separated, then pictures passing through an MPEG2video/audio processing section that processes the signal up to demodulation of MPEG2 images by demodulation algorithms and the demodulation of audio(such as AC-3 or MPEG), are encoded into NTSC or PAL format and are output. The audio is output through a D/A converter. To ensure that images can be output at a variable rate, a buffer memory has the role of absorbing such variations. The entire system is controlled by a CPU that provides system control, to implement as complete system including servos.

With the CD-format signal processing system, on the other hand, the signal is decoded and demodulated, is converted into analog form by an D/A converter via shock-proof memory, then is output as an audio signal. Any subcodes within the detected signal are output simultaneously as video signals by a CD-Graphic (CD-G) processor.

A servo system is used in common for both DVD and CD, and management of the entire system is controlled by the CPU. Parts of the signal processing system can be used in common as appropriate.

The present invention makes it possible to provide a small, light-weight optical disk drive device which is compatible with both DVD-format disks and CD-format disks, by way of example, and which is very reliable with respect to mechanical shock, vibration, and changes in ambient temperature.

The optical integrated unit and optical recording medium drive device in accordance with the present invention have been described above with reference to specific examples thereof. The above specific examples concerned a configuration in which one integrated LD is provided with two laser excitation portion, but it should be obvious that the present invention is not limited to those specific examples.

For example, the wavelengths involved are not limited to 650 nm and 780 nm, and thus it is possible to form a laser excitation portion of a wavelength in the vicinity of 685 nm to enable compatibility between an magneto-optic disk system or a phase-change rewritable optical disk system. This invention can also be applied to the formation of a laser excitation portion with a wavelength of 635 nm for DVD-ROM disks, or to the wavelengths of blue lasers.

Similarly, the present invention can be applied to a system in which three laser excitation portion are integrated into one LD. A typical example of such an LD in which three lasers are used could be one that has a 650-nm light beam for DVD-ROM, a 635-nm light beam for DVD-ROM, and a 780-nm light beam for CD-ROM and CD-R, all integrated into one LD. Similarly, an LD in which three lasers are used could be one that has a 650-nm light beam for DVD-ROM, a 650-nm light beam for DVD-RAM (high-power light beam for writing), and a 780-nm light beam for CD-ROM and CD-R, all integrated into one LD. As another example, a 650-nm light beam for DVD-ROM, a 780-nm light beam for CD-ROM and CD-R (read-out light beam), and a 780-nm light beam for CD-ROM and CD-R (high-power light beam for writing)could be integrated into one LD.

If an LD with a wavelength in the vicinity of 685 nm is used, it is possible to enable compatibility with an magneto-optic disk system or a phase-change rewritable optical disk system.

Various materials other than silicon can be used as the substrate for the optical integrated unit, such as germanium, GaAs, or GaP.

In addition, the mirror surface formed in the substrate of one of these materials is not limited to being in the (111) plane; any other surface position can be selected as appropriate to ensure that the laser beams are reflected perpendicularly upward with respect to the main surface of the substrate. In addition, such a mirror surface could be covered with gold (Au), aluminum (Al), or other highly reflective material.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No.H11-273380 filed on Sep. 27, 1999 including specification, claims, drawings and summary is incorporated herein by reference in its entirety.

What is claimed is:

1. An optical integrated unit comprising:
   a substrate;
   a semiconductor laser element mounted on said substrate, said semiconductor laser element having monolithically integrated first and second laser excitation portions, said first laser excitation portion emitting a first laser beam of a first wavelength and said second laser excitation portion emitting a second laser beam of a second wavelength that differs from said first wavelength, and also said first laser beam and said second laser beam being emitted in a substantially parallel direction with respect to a main surface of said substrate;
   a concavity provided on said substrate;
   a mirror surface provided on a side wall of said concavity; and
   means for providing electrical separation between a first mount portion corresponding to said first laser excitation portion and a second mount portion corresponding to said second laser excitation portion.

2. The optical integrated unit as defined by claim 1, wherein said semiconductor laser element is mounted on a bottom surface of said concavity.

3. The optical integrated unit as defined by claim 1, wherein said means for providing electrical separation is a p-n junction formed on a surface of said substrate.

4. The optical integrated unit as defined by claim 1, wherein said means for providing electrical separation is an isolation layer provided on said substrate and a pair of wiring patterns formed separately on said isolation layer.

5. The optical integrated unit as defined by claim 1, wherein a condition, $y \times \tan(Fv/2) < x$ is satisfied where y is a distance between said semiconductor laser element and said mirror surface, Fv is a perpendicular angle of expansion of said laser beam, and x is a height of a light emitting point of said semiconductor laser element taken from its mounting surface.

6. The optical integrated unit as defined by claim 1, wherein a condition, $T \times \tan(Fv/2) < y$ is satisfied where T is a height of said semiconductor element taken from its light emitting point, Fv is a perpendicular angle of expansion of said laser beam, and y is a distance between said semiconductor laser element and said mirror surface.

7. The optical integrated unit as defined by claim 1, wherein said substrate is formed of a single-crystalline silicon and said main surface of said substrate is inclined from its (100) plane.

8. The optical integrated unit as defined by claim 7, wherein said minor surface is in parallel with a (111) plane of said substrate.

9. The optical integrated unit as defined by claim 1, further comprising a heat sink provided between said substrate and said semiconductor laser element.

10. The optical integrated unit as defined by claim 1, wherein said semiconductor laser element is mounted on said main surface of said substrate, said concavity is provided on a side of a light emitting facet of said semiconductor later element, and said mirror surface is formed to extend above said main surface of said substrate.

11. The optical integrated unit as defined by claim 2, wherein a second concavity dug into part of said bottom surface of said concavity is provided, and said mirror surface is formed to extend continuously to a sidewall of said second concavity.

12. The optical integrated unit as defined by claim 1, wherein said substrate is formed of single-crystalline silicon and has a p-n junction portion that acts as a monitoring light-receiving element for monitoring a laser output of said semiconductor laser element on a side opposite to said mirror surface as seen from said semiconductor laser element.

13. The optical integrated unit as defined by claim 12, wherein said p-n junction portion acting as said monitoring light-receiving element comprises a first monitoring p-n junction portion provided to correspond to said first laser excitation portion and a second monitoring p-n junction portion provided to correspond to said second laser excitation portion.

14. The optical integrated unit as defined by claim 1, wherein said substrate is formed of single-crystalline silicon, and said optical integrated unit is further provided with a first detector p-n junction portion as a first detection light-receiving element for detecting light of said first wavelength that has been reflected by said mirror surface, emitted to the exterior, and reflected back from an optical recording medium, and a second detector p-n junction portion as a second detection light-receiving element for detecting light of said second wavelength that has been reflected by said mirror surface, emitted to the exterior, and reflected back from an optical recording medium.

15. The optical integrated unit as defined by claim 14, wherein said first detector p-n junction portion is disposed on said substrate in such a manner as to receive positive first-order diffracted light that is reflected light of said first wavelength that has been diffracted by a holographic optical element; and said second detector p-n junction portion is disposed on said substrate in such a manner as to receive negative first-order diffracted light that is reflected light of said second wavelength that has been diffracted by said holographic optical element.

16. The optical integrated unit as defined by claim 15, further comprising said holographic optical element.

17. The optical integrated unit as defined by claim 16, wherein said holographic optical element has at least three different diffraction regions;

said first detector p-n junction portion is divided to correspond to three positive first-order light beams that are diffracted by said three different diffraction regions, respectively; and said second detector p-n junction portion is divided to correspond to three negative first-order light beams that are diffracted by said three different diffraction regions.

18. The optical integrated unit as defined by claim 1, wherein said first wavelength is centered on 780 nm; and said second wavelength is centered on any one of 635 nm, 650 nm, and 685 nm.

19. An optical pickup comprising:

an optical integrated unit having:
  a substrate;
  a semiconductor laser element mounted on said substrate, said semiconductor laser element having monolithically integrated first and second laser excitation portions, said first laser excitation portion emitting a first laser beam of a first wavelength and said second laser excitation portion emitting a second laser beam of a second wavelength that differs from said first wavelength, and also said first laser beam and said second laser beam being emitted in a substantially parallel direction with respect to a main surface of said substrate;
  a concavity provided on said substrate;
  a mirror surface provided on a side wall of said concavity; and
  means for providing electrical separation between a first mount portion corresponding to said first laser excitation portion and a second mount portion corresponding to said second laser excitation portion; and an optical system which focuses at least one of said first laser beam and said second laser beam that are reflected by said mirror surface to illuminate an optical recording medium therewith, and also guides light reflected back from said optical recording medium into said optical integrated unit.

20. The optical pickup as defined by claim 19, wherein said substrate is formed of single-crystalline silicon, and said optical integrated unit is further provided with a first detector p-n junction portion as a first detection light-receiving element for detecting light of said first wavelength that has been reflected by said mirror surface, emitted to the exterior, and reflected back from an optical recording medium, and a second detector p-n junction portion as a second detection light-receiving element for detecting light of said second wavelength that has been reflected by said mirror surface, emitted to the exterior, and reflected back from an optical recording medium.

21. The optical pickup as defined by claim 20, further comprising a holographic optical element;

wherein said first detector p-n junction portion is disposed on said substrate in such a manner as to receive positive first-order diffracted light that is reflected light of said first wavelength that has been diffracted by said holographic optical element; and said second detector p-n junction portion is disposed on said substrate in such a manner as to receive negative first-order diffracted light that is reflected light of said second wavelength that has been diffracted by said holographic optical element.

22. An optical recording medium drive device comprising:

an optical pickup having an optical integrated unit comprising:
  a substrate;
  a semiconductor laser element mounted on said substrate, said semiconductor laser element having monolithically integrated first and second laser excitation portions, said first laser excitation portion emitting a first laser beam of a first wavelength and said second laser excitation portion emitting a second laser beam of a second wavelength that differs from said first wavelength, and also said first laser beam and said second laser beam being emitted in a substantially parallel direction with respect to a main surface of said substrate;
  a concavity provided on said substrate;
  a mirror surface provided on a side wall of said concavity; and
  means for providing electrical separation between a first mount portion corresponding to said first laser excitation portion and a second mount portion corresponding to said second laser excitation portion; and an optical system which focuses at least one of said first laser beam and said second laser beam that are reflected by said mirror surface to illuminate an optical recording medium therewith, and also guides light reflected back from said optical recording medium into said optical integrated unit.

23. The optical recording medium drive device as defined by claim 22, wherein said substrate is formed of single-crystalline silicon, and said optical integrated unit is further provided with a first detector p-n junction portion as a first detection light-receiving element for detecting light of said first wavelength that has been reflected by said mirror surface, emitted to the exterior, and reflected back from an optical recording medium, and a second detector p-n junction portion as a second detection light-receiving element for detecting light of said second wavelength that has been reflected by said mirror surface, emitted to the exterior, and reflected back from an optical recording medium.

24. The optical recording medium drive device as defined by claim 23, further comprising a holographic optical element;

wherein said first detector p-n junction portion is disposed on said substrate in such a manner as to receive positive first-order diffracted light that is reflected light of said first wavelength that has been diffracted by said holographic optical element; and said second detector p-n junction portion is disposed on said substrate in such a manner as to receive negative first-order diffracted light that is reflected light of said second wavelength that has been diffracted by said holographic optical element.

* * * * *